(12) United States Patent
Chen et al.

(10) Patent No.: US 10,971,465 B2
(45) Date of Patent: Apr. 6, 2021

(54) DRIVING CHIP, DISPLAY SUBSTRATE, DISPLAY DEVICE AND METHOD FOR MANUFACTURING DISPLAY DEVICE

(71) Applicant: BOE TECHNOLOGY GROUP CO., LTD., Beijing (CN)

(72) Inventors: Liqiang Chen, Beijing (CN); PaoMing Tsai, Beijing (CN); Jianwei Li, Beijing (CN); Dejun Bu, Beijing (CN); Shuang Du, Beijing (CN); Can Zheng, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/125,063

(22) Filed: Sep. 7, 2018

(65) Prior Publication Data

US 2019/0148327 A1 May 16, 2019

(30) Foreign Application Priority Data

Nov. 10, 2017 (CN) .......................... 201711105685.6

(51) Int. Cl.
*H01L 23/00* (2006.01)
*H01L 27/12* (2006.01)
*H01L 27/32* (2006.01)

(52) U.S. Cl.
CPC .......... *H01L 24/17* (2013.01); *H01L 27/1244* (2013.01); *H01L 27/1262* (2013.01); *H01L 27/3244* (2013.01); *H01L 24/13* (2013.01); *H01L 24/14* (2013.01); *H01L 24/16* (2013.01); *H01L 24/81* (2013.01); *H01L 27/1218* (2013.01); *H01L 2224/10125* (2013.01); *H01L 2224/13005* (2013.01); *H01L 2224/13013* (2013.01); *H01L 2224/14051* (2013.01); *H01L 2224/14152* (2013.01); *H01L 2224/14154* (2013.01); *H01L 2224/14155* (2013.01); *H01L 2224/14515* (2013.01);
(Continued)

(58) Field of Classification Search
CPC . H01L 2224/14517; H01L 2224/17517; H01L 2224/14519; H01L 2224/17519; H01L 24/06; H01L 24/14; H01L 2924/3511; H01L 2924/35; H01L 2224/10125; H01L 2224/09517
See application file for complete search history.

(56) References Cited

U.S. PATENT DOCUMENTS 1,008,467 A * 11/1911 Hilbert ................. A01D 78/148
56/366
6,657,124 B2 * 12/2003 Ho ..................... H01L 23/49816
174/521

(Continued)

*Primary Examiner* — David A Zarneke
(74) *Attorney, Agent, or Firm* — Thomas|Horstemeyer, LLP

(57) ABSTRACT

The present disclosure provides a driving chip, a display substrate, a display device and a method for manufacturing a display device. The driving chip according to the present disclosure includes a substrate; and a plurality of connecting bumps and a plurality of supporting bumps disposed on the substrate. The plurality of connecting bumps include at least one set of connecting bumps arranged along a first direction, and the plurality of supporting bumps include the supporting bump that is located between the adjacent connecting bumps arranged along the first direction.

12 Claims, 3 Drawing Sheets

(52) U.S. Cl.
CPC .............. *H01L 2224/16227* (2013.01); *H01L 2224/17517* (2013.01); *H01L 2224/81201* (2013.01); *H01L 2224/81203* (2013.01); *H01L 2924/1426* (2013.01)

(56) References Cited

U.S. PATENT DOCUMENTS

| | | | | |
|---|---|---|---|---|
| 6,677,677 | B2* | 1/2004 | Kimura | H01L 23/50 |
| | | | | 257/737 |
| 6,965,166 | B2* | 11/2005 | Hikita | H01L 24/11 |
| | | | | 257/777 |
| 8,871,629 | B2* | 10/2014 | Yu | H01L 24/14 |
| | | | | 438/612 |
| 9,343,397 | B2* | 5/2016 | Marbella | H05K 1/111 |
| 9,343,419 | B2* | 5/2016 | Yu | H01L 24/11 |
| 9,355,482 | B2* | 5/2016 | Cardno | G06Q 10/06 |
| 9,355,982 | B2* | 5/2016 | Lu | H01L 23/49894 |
| 10,032,738 | B2* | 7/2018 | Park | H01L 24/03 |
| 10,825,799 | B2* | 11/2020 | Shih | H01L 24/05 |
| 2002/0050381 | A1* | 5/2002 | Takao | H01L 23/49838 |
| | | | | 174/545 |
| 2012/0080789 | A1* | 4/2012 | Shiota | H01L 24/92 |
| | | | | 257/737 |
| 2012/0129333 | A1* | 5/2012 | Yim | H01L 24/11 |
| | | | | 438/613 |
| 2018/0151495 | A1* | 5/2018 | Hsu | H01L 24/11 |
| 2018/0337120 | A1* | 11/2018 | Cho | H01L 24/83 |
| 2019/0067230 | A1* | 2/2019 | Liu | H01L 23/3192 |

* cited by examiner

DRIVING CHIP, DISPLAY SUBSTRATE, DISPLAY DEVICE AND METHOD FOR MANUFACTURING DISPLAY DEVICE

CROSS REFERENCE

The present application claims the priority of Chinese Patent application No. 201711105685.6, filed on Nov. 10, 2017, and the entire contents thereof are incorporated herein by reference as part of the present application.

TECHNICAL FIELD

The present disclosure relates to the field of display driving, in particular, to a driving chip a display substrate, a display device and a method for manufacturing the display device.

BACKGROUND

Flexible substrates are increasingly applied to display devices due to their thinness and good impact resistance. For such display device, a flexible substrate is generally fixed on a glass substrate during manufacturing and then the following manufacture processes for the flexible display panel are conducted, which is compatible with existing LCD devices. After the flexible display panel is completed, the flexible substrate is separated from the glass substrate, a membrane material (back film) is attached to the back surface of the flexible substrate to flatten the flexible substrate, and then the processes such as Chip-On-Film (COF) bonding and the like are conducted to realize the bonding of the driving chip (also referred to as IC, in which there is an integrated circuit). However, because COF is expensive and the lines for COF cannot be made too thin, it is impossible to apply COF to manufacturing of the products with high resolution.

Directly bonding a driving chip (COP: Chip on plastic) on a flexible display panel is the future development direction. However, the driving chip has a high hardness, and when the driving chip is compression-bonded to the flexible display panel, it is easy for the connecting bumps on the driving chip to go down to sink due to the effect of high bonding pressure and the flexible display panel may be deformed. This may cause the metal wirings on the flexible display panel connected to the connecting pads to be broken down, thus resulting in defects in the products, such as an open circuit or a short circuit.

SUMMARY

Arrangements of the present disclosure provide a flexible display device with low cost, high resolution and high yield.

According to a first aspect of the present disclosure, there is provided a driving chip including: a substrate; and a plurality of connecting bumps and a plurality of supporting bumps disposed on the substrate. The plurality of connecting bumps include at least one set of connecting bumps arranged along a first direction, and the plurality of supporting bumps include the supporting bump that is located between the adjacent connecting bumps arranged along the first direction.

According to an arrangement, the plurality of connecting bumps further include at least one set of connecting bumps arranged along a second direction that is distinct from the first direction, and the plurality of supporting bumps include the supporting bump that is located between adjacent connecting bumps arranged along the second direction.

According to an arrangement, the plurality of connecting bumps further include a set of connecting bumps arranged along a second direction that is distinct from the first direction, and the plurality of supporting bumps includes the supporting bumps that is arranged along the second direction and correspondingly disposed on at least one side of the set of connecting bumps arranged along the second direction.

According to an arrangement, the plurality of supporting bumps further include supporting bumps that are located on at least one end of the connecting bump arranged along the first direction.

According to an arrangement, the plurality of supporting bumps further include supporting bump that are located on at least one end of the connecting bump arranged along the second direction.

According to an arrangement, the driving chip further includes an input area and an output area. The input area includes a plurality of input bumps and the output area includes a plurality of output bumps. The connecting bumps are the input bumps or the output bumps.

According to an arrangement, the driving chip further includes an input area and an output area. The supporting bumps further include supporting bumps that are regularly disposed within the intermediate area of the driving chip.

According to an arrangement, each of the supporting bumps has a thickness smaller than or equal to a thickness of each of the connecting bumps.

A second aspect of the present disclosure provides a display substrate including: at least one set of connecting pads disposed on the display substrate and arranged along the first direction. The display substrate further includes supporting pads disposed between adjacent connecting pads arranged along the first direction.

According to an arrangement, the display substrate further includes at least one set of connecting pads arranged along a second direction that is distinct from the first direction, and supporting pads are disposed between the adjacent connecting pads arranged along the second direction.

A third aspect of the present disclosure provides a display device. The display device includes a flexible display panel including a substrate and connecting pads disposed on the display substrate; and a driving chip according to the first aspect of the present disclosure.

The connecting bumps on the driving chip and the connecting pads on the display substrate correspond to each other one to one and are electrically connected to each other.

According to an arrangement, the connecting dumps and the corresponding connecting pads are compression-bonded.

According to an arrangement, each of the connecting pads has a size greater than a size of a corresponding connecting bump.

According to an arrangement, the flexible display panel further includes supporting pads formed on the display substrate and corresponding to the supporting bumps of the driving chip.

A fourth aspect of the present disclosure provides a method for manufacturing a display device. The method includes providing a flexible display panel including a display substrate and connecting pads disposed on the display substrate.

The method includes providing the driving chip according to the first aspect of the present disclosure. The method includes electrically connecting the connecting bumps on the driving chip to the connecting pads on the display substrate. The connecting bumps on the driving chip correspond to the connecting pads on the display substrate one to one.

According to an arrangement, the connecting bumps and the corresponding connecting pads are electrically connected to each other by compression-bonding.

BRIEF DESCRIPTION OF THE DRAWINGS

The specific arrangements of the present disclosure are further described in detail below with reference to the accompanying drawings.

DETAILED DESCRIPTION

Figure 1:
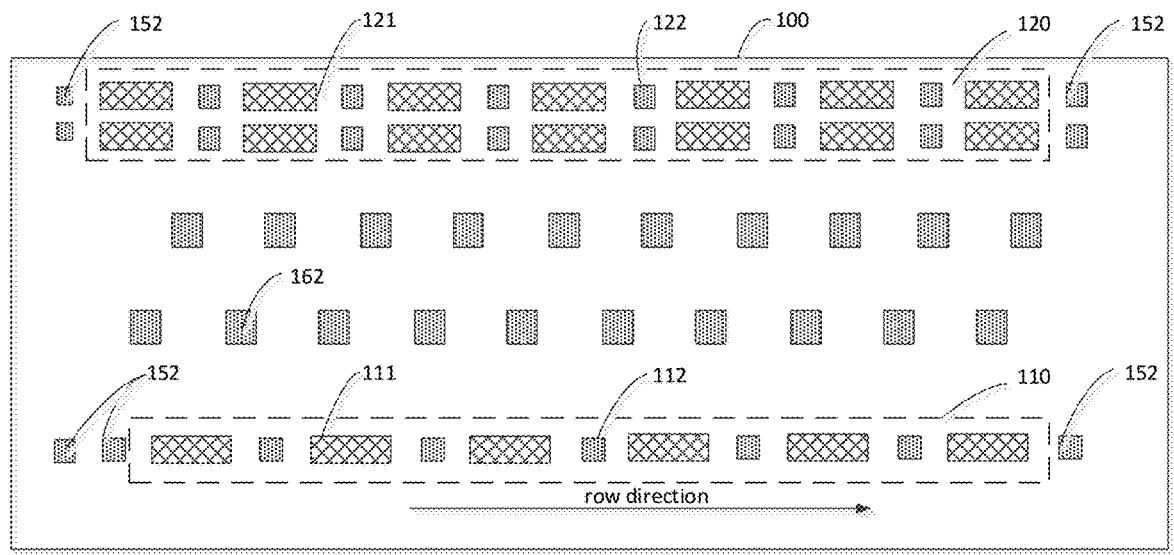
FIG. 1 is a schematic diagram illustrating a driving chip according to an arrangement of the present disclosure.

In order to explain the present disclosure more clearly, the present disclosure will be further described in conjunction with the exemplary arrangements and the accompanying drawings. Similar components in the drawings are denoted by the same reference numerals, and the components are not drawn to scale. It should be understood by those skilled in the art that the following detailed description is not intended to be illustrative, but not restrictive, and thus should not be used to limit the scope of the present disclosure.

As will be understood by those skilled in the art, the driving chip includes an input area and an output area that are generally disposed adjacent to the edge of the chip, the input area includes a plurality of input bumps, and the output area includes a plurality of output bumps. In the present disclosure, the term "connection bump" refers to an input bump or output bump in the input or output area of the driving chip for electrically connecting with a connecting pad on a flexible display panel or with a flexible printed circuit board FPC. The connecting bumps are electrically connected to the driving circuit in the driving chip, and the input signal from the FPC is processed and output to the flexible display pane, so as to drive and control the display panel. The term "supporting bump" as used in the present disclosure refers to a bump that can act as a support with no signal or electrical conduction. Thus, the "supporting bump" can also be regarded as "dummy bump".

As shown in FIG. 1, an arrangement of the present disclosure provides a driving chip including a substrate 100, and a plurality of connecting bumps 111, 121 and a plurality of supporting bumps 112, 122 disposed on the substrate. The driving chip includes an input area 110 and an output area 120 disposed adjacent to the two long sides of the driving chip respectively, facilitating electrical connection of the driving chip and the flexible display panel. In the input area 110 of the driving chip, a set of connecting bumps arranged in the row direction are included, and first supporting bumps 112 are disposed between the adjacent connecting bumps. In the output area 120 of the driving chip, two sets of connecting bumps arranged in the row direction are included, and first supporting bumps 122 are disposed between the adjacent connecting bumps in each set of connecting bumps arranged in the row direction. It should be understood that the number of connecting bumps, the number of rows of connecting bumps, the size of each of the connecting bumps, and the shape and size of each of the first supporting bumps may be set as needed. In different areas, the sizes of different sets of the connecting bumps may be the same or different. In different areas, the sizes of the first supporting bumps located between the connection bumps may be the same or different. If the first supporting bumps are too small, they cannot uniformly share or bear the pressure generated by connection of bumps in the compression-bonding process and cannot prevent the deformation of the flexible display panel due to the pressure by the flexible display panel, and the deformation of the flexible display panel is prone to cause the wirings to be broken down. If the first supporting bumps are too large, the supporting bumps are difficult to be accurately positioned between adjacent connecting pads of the flexible display panel, and this may affect the effective electrical connection between the connecting bumps on the driving chip and the connecting pads on the flexible display panel. A person skilled in the art can determine the specific sizes of the connecting bumps and the first supporting bumps according to the layout of the connecting bumps, the layout of the first supporting bumps, and the wiring scheme of the display panel.

Further shown in FIG. 1, as an exemplary arrangement, the driving chip further includes second supporting bumps 152 at both ends of a set of connecting bumps arranged in a row. In another exemplary arrangement, the driving chip further includes second supporting bumps 162 located in the middle area of the driving chip between the input area and the output area. FIG. 1 shows an arrangement in which the second supporting bumps in the middle area are regularly disposed and the supporting bumps in the edge areas do not correspond each other exactly. It should be understood that the layout for the second supporting bumps in the middle area is not limited to that shown in the drawings. The second supporting bumps should be symmetrically and evenly disposed as much as possible to avoid deformation of the driving chip under stress. Unlike the first supporting bumps 112, 122 between the connecting bumps, the second supporting bumps 152 located at the edge area and the second supporting bumps 162 located at the middle area are used to avoid that electrical performance of the driving chip is affected and even the driving chip is broken down due to the deformation of the chip during compression-bonding.

Figure 2:
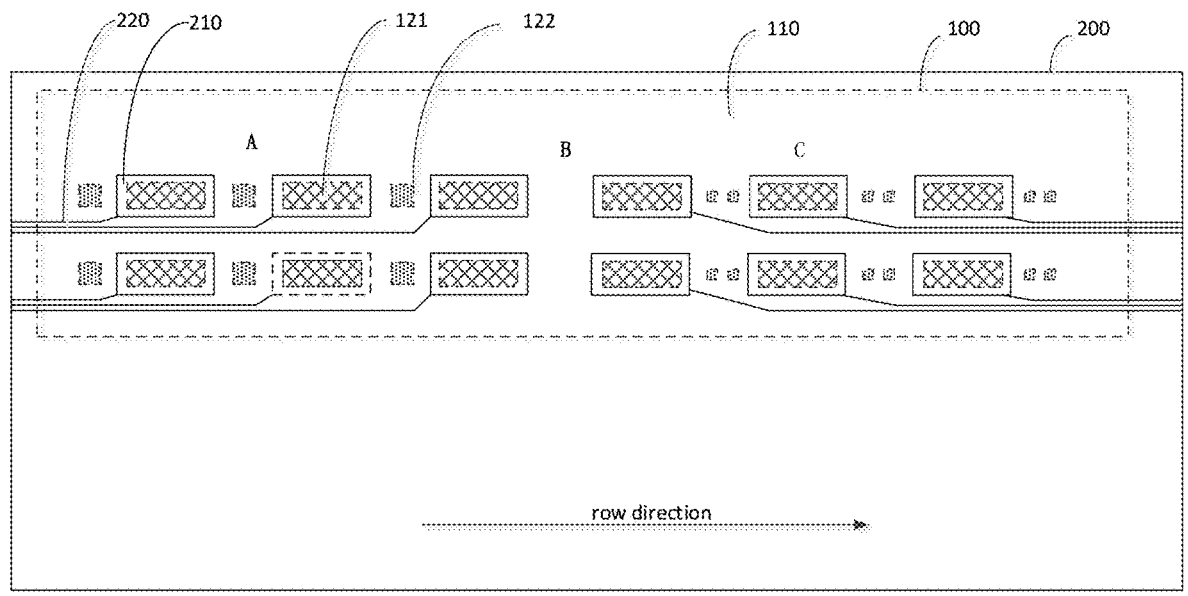
FIG. 2 is a schematic diagram illustrating connection of a display substrate corresponding to an output area of a driving chip according to another arrangement of the present disclosure with the driving chip.

FIG. 2 is a schematic diagram illustrating the corresponding electrical connection of connecting bumps on a driving chip with connecting pads on a flexible display panel according to another arrangement of the present disclosure. In this arrangement, the output area 120 of the driving chip 100 is correspondingly connected to the flexible display panel 200. For example, as shown, the output area of the driving chip includes two sets of connecting bumps 121 arranged in a row. First supporting bumps are disposed between some adjacent connecting bumps arranged in the row direction (see area A), and there is no supporting bump between some adjacent connecting bumps, as shown in area B. There are two first supporting bumps between some adjacent connecting bumps. The size of the connecting pads 210 is generally larger than that of the corresponding connecting bump, and the first supporting bumps and the connecting pads are in correspondence with each other one-to-one and are electrically connected with each other. In this arrangement, the wirings of the connecting pads extend between rows of connecting pads arranged in a row, and the first supporting bumps are arranged in a row disposed between the connecting bumps. On the one hand, such arrangement provides support for the flexible display panel, especially for the area in which the flexible display panel corresponds to the connecting pads, to avoid deformation of the flexible display panel during electrical connection process such as compression-bonding process, the deformation may result in breakage of the connection wirings. On the other hand, the supporting bumps are not disposed between the rows of connecting bumps to avoid deformation of the connection wiring between the rows that results from the applied pressure during bonding. In this way, the quality of the connection wirings of the flexible display panel is effectively improved during bonding the driving chip to the flexible display panel, and this improves process stability and product quality for entire display device.

The inventors have found that a flexible display device with low cost and high resolution can be obtained by directly connecting the driving chip to the display device of the flexible display panel electrically. In the arrangement of the present disclosure, arrangement of the first supporting bumps at least between the adjacent connecting bumps arranged in a row on the driving chip are capable of reducing the blank area between the connecting bumps, and thus, when the connecting bumps and the flexible display panel are electrically connected, especially by compression-bonding, the first supporting bumps can support the flexible display panel. The "compression-bonding" herein refers to the process that the driving chip are connected to the flexible display panel by pressing the driving chip onto the flexibly display panel (e.g., a pressure or force is applied on the driving chip or the flexible display panel) so as to realize bonding between the driving chip and the flexible display. Accordingly, this greatly reduces the deformation probability and deformation degree of the flexible display panel during the electrical connection. As a result, defects due to the deformation resulting from the pressure and breakage, such as open circuit or short circuit that may occur in the metal signal lines connecting the connection bumps and the display device on the flexible display panel can be further reduced, and thus product yield is improved.

In an exemplary example, the supporting bumps 112, 122, 152, 162 have a thickness less than or equal to the thickness of each of the connecting bumps 111.

Here, the "thickness" herein means a height at which a connection bump and a support bump protrude from the surface of the driving chip in a direction perpendicular to the substrate.

When the thickness of each of the first supporting bumps 112, 122 between the adjacent connecting bumps is less than or equal to the thickness of each of the connecting bumps 111, 121, the supporting bumps 112, 122 are good for supporting while the connection reliability of the connecting bumps 111, 121 can be improved.

Specifically, when the thickness of each of the supporting bumps 112, 122, 152, 162 is the same as that of each of the connecting bumps 111, 121, the force on the flexible display panel can be more balanced and the degree of bending deformation is relatively small during electrical connection of the driving chip and the flexible display panel, thus greatly reducing the risk of defects, such as open circuit or short circuit, caused by the breakage of the metal signal lines on the flexible display panel.

When the thickness of each the first supporting bumps and the thickness of each the second supporting bumps are smaller than the thickness of each the connecting bumps, the flexible display panel is deformed to a certain extent and may even contact the supporting bumps, but the degree of such deformation is relatively small, which is good for preventing metal signal lines from being broken down. The thickness of each of the supporting bumps can be set according to actual conditions. In an exemplary example, the thickness of each of the supporting bumps is ½ to ⅞, ¾ to ⅞ or the like of the thickness of each of the connecting bump 111.

In an exemplary example, the distance between a first supporting bump 112 and its adjacent or neighboring connecting bump 111 is 30 μm to 40 μm. It should be understood that under such condiction, this distance may be any value or range between 30 μm and 40 μm. For example, the distance is 30 μm, 32 μm, 34 μm, 36 μm, 38 μm, or the like.

Generally, the material of the connecting bumps 111, 121 on the driving chip may be a metal material having good ductility and conductivity, such as gold. When the driving chip is electrically connected to the flexible display panel, the connecting bumps 111, 121 are depressed, deformed and extended downward to a certain degree under the pressure. Defining the distance between the first supporting bumps 112, 122 and their neighboring connecting bumps 111 as 30 μm to 40 μm has the following advantages. When the driving chip is electrically connected to the flexible display panel, if the distance between the connection pads and their first supporting bumps 112, 122 is too small, it would be difficult for position alignment, thus resulting in short circuit. If the the distance between the connection pads and their first supporting bumps 112, 122 is too large, the supporting bumps cannot effectively play the supporting role.

In an exemplary arrangement, the length of each of the first supporting bumps 112, 122 in the row direction is from 8 μm to 15 μm. The length of each of the first supporting bumps 112, 122 in the row direction refers to the distance between two points on the upper surface of the supporting bump 112 which are the farthest from each other in the row direction. The length of each of the supporting bumps 112, 122 is selected to play the support role so as to prevent the flexible display panel from being deformed. However, the length of each of the supporting bumps 112, 122 should not be too long, because over long supporting bumps 112, 122 will result in that adjacent connection pads may be laid to the same first supporting bump, thus causing a short circuit.

In still another exemplary example, the supporting bumps 112, 122 and the connecting bumps 111, 121 are made of the same material. For example, the bumps may be selected from materials having good ductility and conductivity, such as gold. Of course, according to different needs, the materials and process parameters that are specifically used can be flexibly adjusted to match production equipment. It can be understood that the supporting bumps 112, 122 and the connecting bumps 111, 121 with the same material have the similar hardness, and can also be formed by the same manufacturing process, and this is for the purpose of convenience in production.

In still another exemplary example, the size of each of the first supporting bumps is smaller than the size of each of the adjacent connecting bumps.

Specifically, the size of each of the supporting bumps being smaller than the size of each of the adjacent connecting bumps may refer to that the length of each of the supporting bumps in the row direction is smaller than the length of each of the connecting bumps, or that the width of each of the first supporting bumps in a direction perpendicular to the row direction is smaller than the width of each of the adjacent connecting bumps. Further, it can be understood by those skilled in the art that the area of each of the first supporting bumps is smaller than the area of each of the adjacent connecting bumps.

In this arrangement, there is no specific requirement for the specific shapes of the first supporting bumps 112, 122, so long as the bumps 112, 122 can be used for supporting. In an exemplary example, the shape of each of the supporting bumps is a cylindrical shape, an elliptical cylindrical shape, a rectangular parallelepiped shape or a square shape. Under such condition, the surface of each of the supporting bumps that plays a role for supporting is large, and the effect of preventing the flexible display panel from being deformed is significant, thus preventing the metal signal lines from being broken down.

In order to further balance the force on the flexible display panel during the electrical connection process, in an exemplary example, the driving chip further includes second intermediate area supporting bumps 162 disposed between the signal input area 110 and the signal output area 120.

Figure 3:
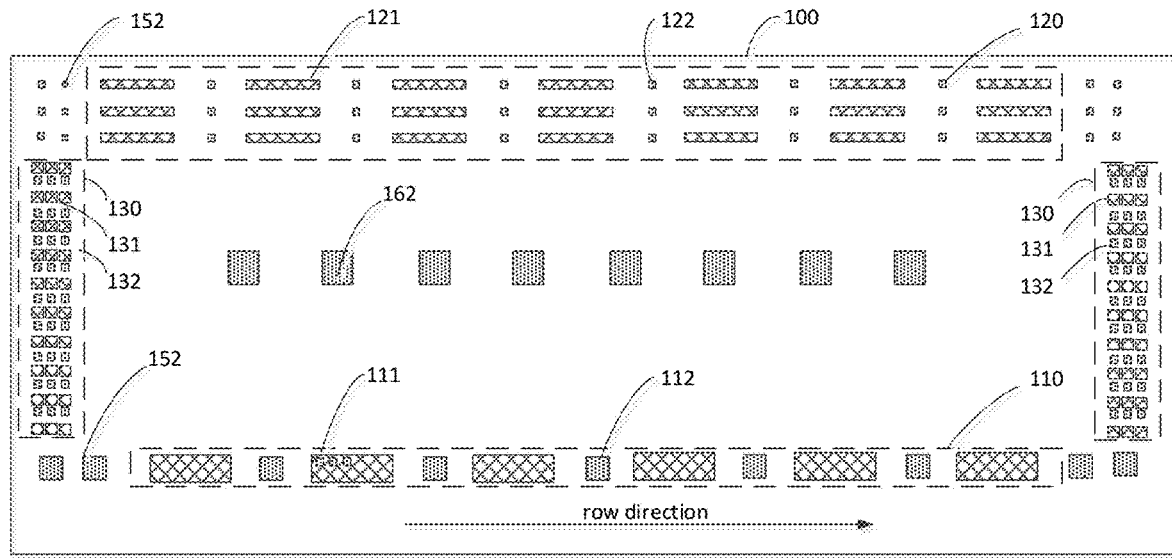
FIG. 3 is a schematic diagram illustrating a driving chip according to another arrangement of the present disclosure.

In a further exemplary example, the plurality of second supporting bumps 162 may be arranged in a single row (FIG. 1) or in a plurality of rows (FIG. 3). The plurality of second supporting bumps 162 may evenly arranged between the input area and the output area of the driving chip symmetrically or asymmetrically. Such arrangement makes the force on the driving chip is balanced, avoids the driving chip from being deformed and damaged, and improves product yield.

In addition, in the arrangement of the present disclosure, the materials and shapes of the supporting bumps 152, 162 may be the same as those of the first supporting bumps 112, 122. Correspondingly, the connecting bumps and the supporting bumps can be formed by the same manufacturing process.

In a third arrangement of the present disclosure, a driving chip is provided. As shown in FIG. 3, the driving chip includes an input area 110 and an output area 120 disposed along a long side, and the output area 120 includes three sets of the connecting bumps 121 and the first supporting bumps 122 arranged along the row direction. The input area connecting bumps and the first supporting bumps are the same as those of the first arrangement, and repeated description will be omitted herein. In this arrangement, the driving chip 100 further includes an output area 130 disposed adjacent to the two short sides of the driving chip. Specifically, the output area 130 includes three columns of connecting bumps 131 arranged along the column direction, and first supporting bumps 132 are disposed between the adjacent columns of connecting bumps, avoiding the wirings on the flexible display panel from being broken down due to the excessive gap between connecting bumps during the process for electrical connection of the driving chip to the flexible display panel, and this can improve yield. It can be understood that the flexible display panel includes connecting pads corresponding to the connecting bumps on the output area 130 of the driving chip one to one, and the first supporting bumps are located between the corresponding connecting pads to reduce the gap between the connecting pads, thus improving the quality of the display device.

According to an exemplary example of this arrangement, the second supporting bump 162 is disposed in an intermediate area of the drive chip in the row direction to provide support for the drive chip.

Figure 4:
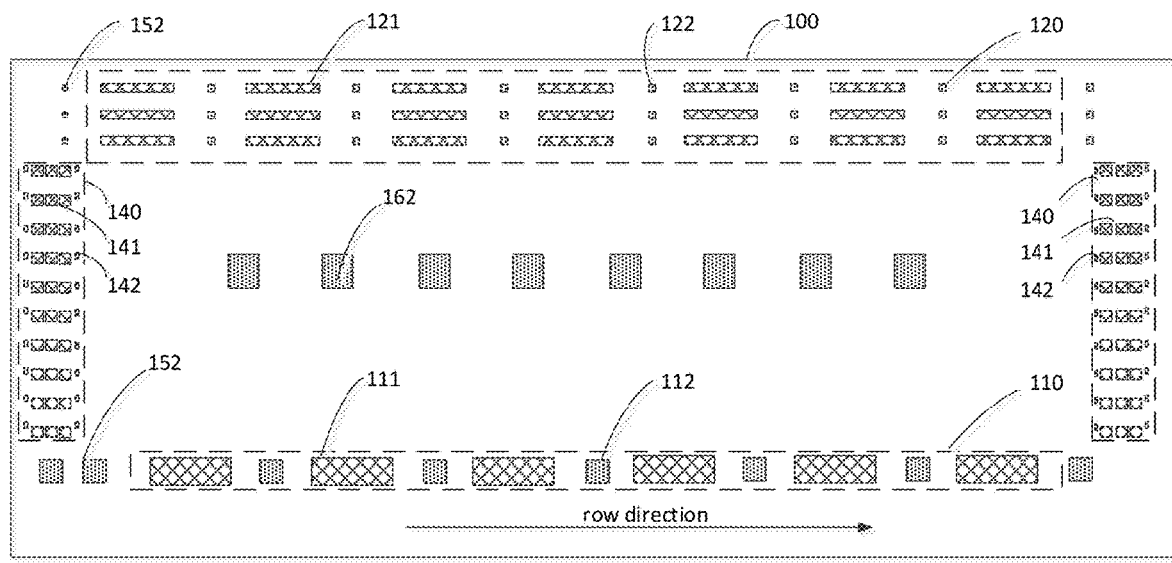
FIG. 4 is a schematic diagram illustrating a driving chip according to another arrangement of the present disclosure.

In a fourth arrangement of the present disclosure, a driving chip is provided. As shown in FIG. 4, the driving chip includes an input area 110 and an output area 120 disposed along a long side, and the output area 120 includes three sets of the connecting bumps 121 and the first supporting bumps 122 arranged in the row direction, the input area connecting bumps and the first supporting bumps are the same as those of the first arrangement, and the repeated description will be omitted herein. In this arrangement, the driving chip 100 further includes an output area 140 disposed adjacent to the two short sides of the driving chip. Specifically, the output area 140 includes a connecting bump group including three columns of connecting bumps 141 arranged in the column direction. Two outer side of this connecting bump group is provided with first supporting bumps 132 arranged in the column direction, which correspond to the adjacent connecting bumps one to one, thus avoiding the wirings on the flexible display panel from being broken down due to connection during the process for electrical connection of the driving chip to the flexible display panel, and this can improve product quality. It can be understood that the flexible display panel includes connection pads corresponding to the connecting bumps on the output area 140 of the driving chip one to one, and the first supporting bumps are located outside the corresponding connecting pads to reduce the gap between the connecting pads, thus improving the quality of the display device. Further, the output area 140 includes a connecting bump group of three columns of connecting bumps 141 and first supporting bumps 142 arranged along a column on both sides of the connecting bump group. After reading the present disclosure, those skilled in the art can solve the technical problem of the present disclosure by appropriately arranging the position and size of the supporting bumps as needed.

In still another arrangement of the present disclosure, a display substrate is provided, including at least one set of connecting pads disposed on the display substrate and arranged along the first direction, and supporting pads is disposed between the adjacent connecting pads arranged along the first direction. In the case where the thickness of each of the supporting bumps is smaller than the thickness of each of the connecting bumps, the supporting pads can be provided, corresponding to the supporting bumps on the flexible display panel, and the forces applied on the driving chip and the flexible display panel can be uniform.

In an exemplary example, the display substrate further includes at least one set of connecting pads arranged along a second direction that is distinct from the first direction, and supporting pads are disposed between the adjacent connecting pads arranged along the second direction.

In another arrangement of the present disclosure, a display device is provided, including:
  a flexible display panel including a display substrate and connecting pads disposed on the display substrate; and
  the driving chip according to any one of the above arrangements.

The connecting bumps on the driving chip and the connecting pads on the display substrate correspond to each other one to one and are electrically connected to each other In an exemplary example, the size of each of the connecting pads is greater than the size of the corresponding connecting bump such that after electrical connection, the outer contour of each of the connecting pad is larger than the outer contour of a corresponding connecting bump. As a result, the connecting bumps can be located under the connecting pads as much as possible, increasing the contact area there-between to improve the reliability of the electrical connection.

In the display device shown in this arrangement, the flexible display panel is a flexible display panel with a conventional structure in the art, for example, it also includes a display device, which will not be described herein. In the flexible display panel, a flexible circuit board is provided with a corresponding connecting pad, one end of which is electrically connected to the connecting bump on the signal input area of the driving chip, and the other end is connected with the wiring in the flexible circuit board through the corresponding metal signal line. In the flexible display panel, referring to FIG. 2, the display device and the connecting pads 210 formed on the display substrate 200 are electrically connected through corresponding metal signal lines 220. In addition, the flexible display panel further includes a base substrate bonded to the display substrate 200 by a pressure sensitive adhesive, the base substrate includes but is not limited to a flexible PET substrate.

In this arrangement, the display device may include, but is not limited to, a liquid crystal panel, an OLED panel, a liquid crystal television, a liquid crystal display, an electronic paper, a digital photo frame, a mobile phone, a tablet computer, and an electrophoretic display device.

In the display device provided by arrangements of the present disclosure, the driving chip is directly electrically connected to the flexible display panel, and thus the formed flexible display device has high resolution. Also, since the driving chip is directly electrically connected to the flexible display panel, the COF bonding is omitted, thus the manufacturing cost is lower. In addition, when the connecting bumps 111, 121 on the driving chip and the corresponding connecting pads 211 are electrically connected, especially by compression bonding, the supporting bumps 112, 122 in the driving chip provide supporting force for the compression bonding, so that the force applied on the flexible display panel is more balanced, and the degree and probability of deformation under the pressure during the electrical connection are reduced, and as a result, defects on the metal signal lines 220 due to deformation and breaking down, such as open circuit or short circuit, can be reduced. According to an exemplary example, the flexible display panel further includes connecting pads formed on the display substrate and corresponding to the supporting bumps of the driving chip, thus further reducing the amount of deformation of the flexible display panel.

Figure 5:
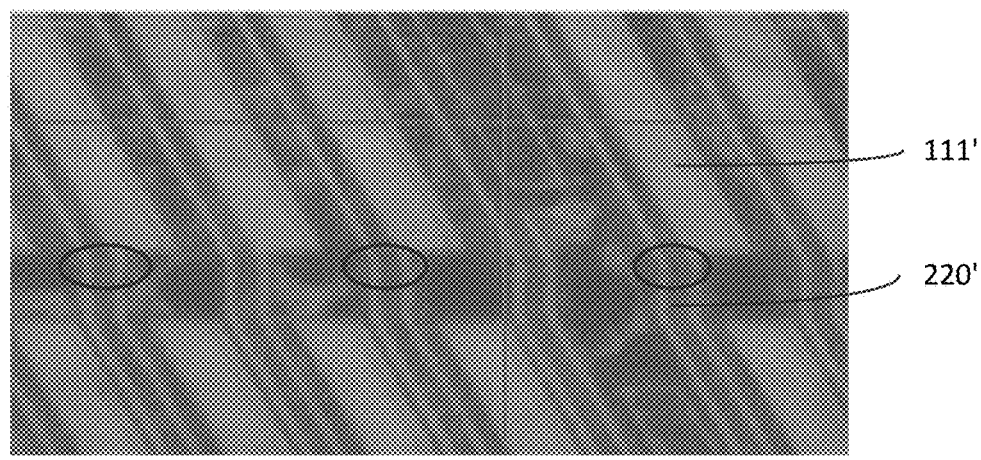
FIG. 5 is a picture in which the existing driving chip is bonded to a flexible display panel by compression-bonding.
Figure 6:
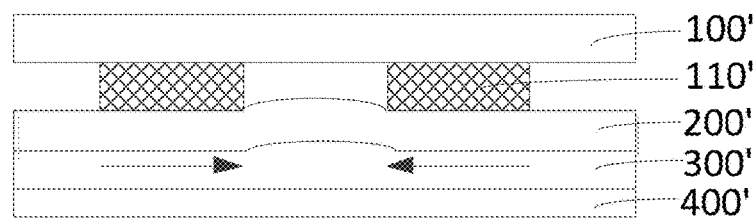
FIG. 6 is a schematic diagram illustrating a defect caused by connection of the existing driving chip with a flexible display panel by compression-bonding.

As a control example, FIG. 5 illustrates a case where the metal signal lines 220' on the flexible display panel are broken down under the pressure, when the existing driving chip which does not include the first supporting bump is pressed to the flexible display panel. The figure is a cross-sectional view taken from the connecting bump 111' on the driving chip. As can be seen from the figure, the metal signal lines are prone to be broken down near the joint between the connecting pads and the metal signal lines, as shown in the elliptical area in the figure. As also can be seen from FIG. 6, during the compression process, under the pressure, the pressure sensitive adhesive 300' that connects the base substrate 400' and the display substrate 200' is pressed toward the blank area around the connecting bump 111' on the body portion 100' of the driving chip, such that the flexible display substrate 200' is also deformed and pressured, and this further results in the breakage of the metal signal lines.

In an exemplary example, the connecting bumps and the corresponding connecting pads 210 are compression bonded. The compression bonding process is simple and easy to be implemented with high connection reliability. In addition, the supporting bumps on the driving chip can prevent metal signal lines 220 from being broken down in the case where, due to the excessive gap between the adjacent connecting bumps, the flexible display panel is deformed during compression (or pressing), and this greatly improves the application effect of the compression bonding process.

In the process of electrical connection, there is a certain alignment precision error, which may affect the reliability of the electrical connection. To further solve the problem, in an exemplary example, the size of each of the connecting pads is greater than that of each of the connecting bumps which are electrically connected with the connecting pads such that the outer contour of each of the connecting pads is greater than the outer contour of each of the connecting bumps after electrical connection. As a result, when the connecting bumps and connecting pads are connected, the connecting bumps can be in contact with the connecting pads as much as possible, and the contact area between the connecting bumps and connecting pads is larger, and this improves the reliability of the electrical connection.

Figure 7:
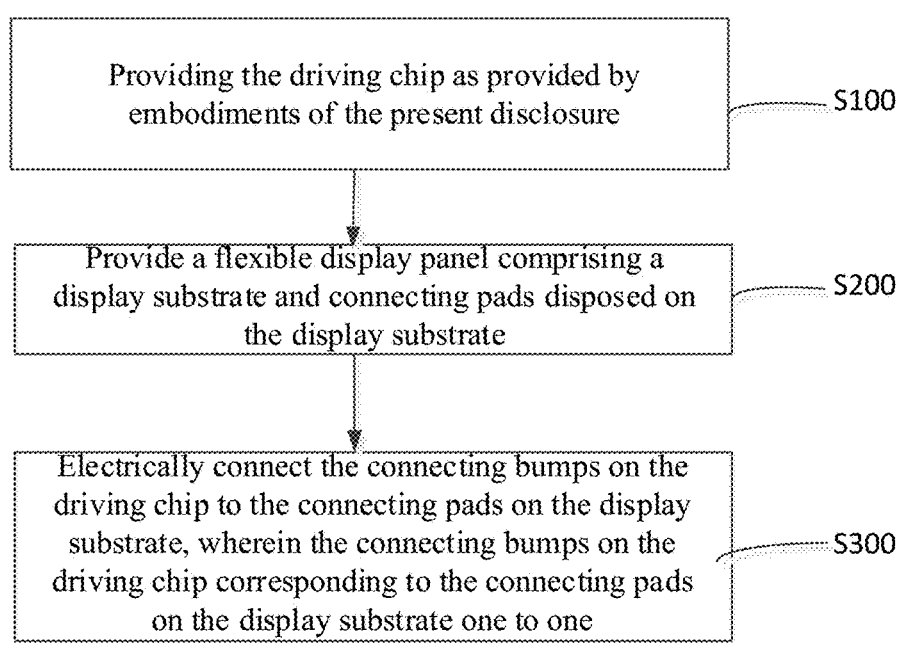
FIG. 7 is a flowchart illustrating a manufacture processes for a display device according to the present disclosure.

In another arrangement of the present disclosure, a method for manufacturing a display device is provided in FIG. 7. The method can include the following steps.

In S100, the driving chip according to any one of the above arrangements is provided.

In S200, a flexible display panel is provided, including a display substrate and connecting pads disposed on the display substrate.

The manufacture for the flexible display panel is the prior art and those skilled in the art can manufacture the flexible display as needed. Taking the display device of FIGS. 3 and 4 as the examples, the above method may include for example:

providing a base substrate 400;

providing a display substrate 200 including connecting pads 210 on the display substrate 200 and metal signal lines 220 connected to the connecting pads 210; and bonding the display substrate 200 to the base substrate 400 by a pressure sensitive adhesive 300.

In S300, the connecting bumps on the driving chip and the connecting pads on the display substrate are corresponded to each other one to one and are electrically connected to each other.

Taking the display device of FIG. 2 as an example, for example, the connecting bumps 121 on the signal output end 120 of the driving chip are electrically connected to corresponding connecting pads 210 on the display substrate 200, and the first supporting bumps 121 on the signal output end of the driving chip are located between the corresponding adjacent connecting pads 210. The corresponding connecting pads 210 are connected to the display devices on the flexible display panel through the metal signal lines 220.

It can be understood that the connecting pads 210 connected to the connecting bumps 121 on the signal output area 120 of the driving chip are electrically connected to the flexible circuit board of the flexible display panel through the corresponding metal signal lines 220.

In the manufacturing method, compared with the COF bonding, connecting the driving chip to the flexible display panel directly can form a display device with lower cost and high resolution. Further, both the first supporting bumps and the second supporting bumps disposed on the driving chip provide supporting force, such that the force applied on the flexible display panel is more balanced during the electrical connection process, and this reduces the degree and probability of deformation due to the pressure, thus reducing the risk of open circuit or short circuit resulting from that the metal signal lines on the surface are broken down due to deformation.

In an exemplary example, the connecting bumps are electrically connected to the corresponding connecting pads by compression bonding. In the compression bonding process, due to a certain bonding pressure and the high hardness of the driving chip, the flexible display panel may be deformed and this may cause the metal signal lines on the display panel to be broken down. In this arrangement, the first supporting bumps and the second supporting bumps on the driving chip can effectively solve the problem.

In another exemplary example, the size of each of the connecting pads is greater than the size of each of the connecting bumps that are electrically connected thereto. In this way, the connection between the connecting pads and the connecting bumps can be ensured as much as possible, the connecting bumps are located under the connecting pads, and the contact area between the connecting pads and the connecting bumps is large, thus improving the reliability of the electrical connection.

In this arrangement, the display device may include, but is not limited to, a liquid crystal panel, an OLED panel, a liquid crystal television, a liquid crystal display, an electronic paper, a digital photo frame, a mobile phone, a tablet computer, an electrophoretic display device, or any other product or part having display function.

It is apparent that the above-described arrangements of the present disclosure are merely illustrative and are not intended to limit the arrangements of the present disclosure. Those skilled in the art can also make other modifications or alterations based on the above description and all of arrangements of the present disclosure cannot be illustrated exhaustively herein. Those obvious modifications and alterations derived from the technical solution of the present disclosure should be regarded as within the scope of the present disclosure.

What is claimed is:

1. A driving chip, comprising:
    a substrate comprising a plurality of supporting bumps disposed thereon;
    an input area comprising a plurality of input bumps;
    an output area comprising a plurality of output bumps; and
    an intermediate area;
    wherein the plurality of input bumps comprise at least one set of connecting bumps arranged along a first direction, and the plurality of supporting bumps comprise first supporting bumps that are located between adjacent input bumps arranged along the first direction;
    wherein the plurality of output bumps comprise at least one set of connecting bumps arranged along the first direction, and the plurality of supporting bumps comprise first supporting bumps that are located between adjacent output bumps arranged along the first direction;
    wherein the plurality of supporting bumps further comprise intermediate area supporting bumps that are regularly disposed within the intermediate area;
    wherein a distance between one of the first supporting bumps and its adjacent or neighboring input bump or output bump in the first direction is 30 μm to 40 μm;
    wherein the connecting bumps are higher than the first supporting bumps with respect to the substrate, and a size of each of the first supporting bumps is smaller than a size of a neighboring connecting bump;
    wherein the connecting bumps are arranged in rows and connecting wirings are arranged in gaps between the rows; and
    wherein for connecting bumps in a same row, a first number of first supporting bumps are arranged between two of the connecting bumps in the same row, a second number of first supporting bumps are arranged between another two of the connecting bumps in the same row, the first number is different from the second number.

2. The driving chip according to claim 1, wherein the plurality of connecting bumps further comprise at least one set of connecting bumps arranged along a second direction that is distinct from the first direction, and the plurality of supporting bumps comprise supporting bumps that are located between adjacent connecting bumps arranged along the second direction.

3. The driving chip according to claim 1, wherein the plurality of connecting bumps further comprise a set of connecting bumps arranged along a second direction that is distinct from the first direction, and the plurality of supporting bumps comprise the supporting bumps that are arranged along the second direction and correspondingly disposed on at least one side of the set of connecting bumps arranged along the second direction.

4. The driving chip according to claim 1, wherein the plurality of supporting bumps further comprise supporting bumps that are located on at least one end of the input bumps or output bumps arranged along the first direction.

5. The driving chip according to claim 2, wherein the plurality of supporting bumps further comprise supporting bumps that are located on at least one end of the connecting bump arranged along the second direction.

6. The driving chip according to claim 3, wherein the plurality of supporting bumps further comprise supporting bumps that are located on at least one end of the connecting bump arranged along the second direction.

7. The driving chip according to claim 1, wherein the driving chip is implemented in a display device.

8. The driving chip according to claim 7, wherein the display device comprises a flexible display panel having a display substrate and a plurality of connecting pads disposed thereon.

9. The driving chip according to claim 8, wherein the connecting bumps of the driving chip and the connecting pads on the display substrate correspond to each other one to one and are electrically connected to each other.

10. A display device, comprising:
    a flexible display panel comprising a display substrate and connecting pads disposed on the display substrate; and
    a driving chip, comprising:
        a substrate comprising a plurality of supporting bumps disposed thereon;
        an input area comprising a plurality of input bumps;
        an output area comprising a plurality of output bumps;
        an intermediate area; and
        wherein the plurality of input bumps comprise at least one set of connecting bumps arranged along a first direction, and the plurality of supporting bumps comprise first supporting bumps that are located between adjacent input bumps arranged along the first direction;
        wherein the plurality of output bumps comprise at least one set of connecting bumps arranged along the first direction, and the plurality of supporting bumps comprise first supporting bumps that are located between adjacent output bumps arranged along the first direction;

wherein the plurality of supporting bumps further comprise intermediate area supporting bumps that are regularly disposed within the intermediate area;

wherein a distance between one of the first supporting bumps and its adjacent or neighboring input bump or output bump in the first direction is 30 μm to 40 μm;

wherein the connecting bumps are higher than the first supporting bumps with respect to the substrate, and a size of each of the first supporting bumps is smaller than a size of a neighboring connecting bump;

wherein the connecting bumps are arranged in rows and connecting wirings are arranged in gaps between the rows; and wherein for connecting bumps in a same row, a first number of first supporting bumps are arranged between two of the connecting bumps in the same row, a second number of first supporting bumps are arranged between another two of the connecting bumps in the same row, the first number is different from the second number; and wherein the connecting bumps on the driving chip and the connecting pads on the display substrate correspond to each other one to one and are electrically connected to each other.

11. The display device according to claim 10, wherein each of the connecting pads has a size greater than a size of a corresponding connecting bump.

12. The display device according to claim 10, wherein the flexible display panel further comprises supporting pads formed on the display substrate and corresponding to the supporting bumps of the driving chip.

* * * * *